(12) United States Patent
Westwick et al.

(10) Patent No.: US 9,966,960 B2
(45) Date of Patent: May 8, 2018

(54) CONFIGURABLE LOGIC CIRCUIT INCLUDING DYNAMIC LOOKUP TABLE

(71) Applicant: Silicon Laboratories Inc., Austin, TX (US)

(72) Inventors: Alan Lee Westwick, Austin, TX (US); Soh Kok Hong, Singapore (SG); Low Yung Lih, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days. days.

(21) Appl. No.: 14/574,112

(22) Filed: Dec. 17, 2014

(65) Prior Publication Data

US 2016/0182054 A1  Jun. 23, 2016

(51) Int. Cl.
*H03K 19/177* (2006.01)
*H03K 19/173* (2006.01)

(52) U.S. Cl.
CPC ... *H03K 19/17728* (2013.01); *H03K 19/1737* (2013.01); *H03K 19/17732* (2013.01); *H03K 19/17744* (2013.01)

(58) Field of Classification Search
None
See application file for complete search history.

(56) References Cited

U.S. PATENT DOCUMENTS

| | | | | |
|---|---|---|---|---|
| 5,442,577 A * | 8/1995 | Cohen | ...................... | G06F 7/575 326/37 |
| 5,606,680 A * | 2/1997 | Parvereshi | ................ | G06F 1/14 711/2 |
| 5,646,545 A * | 7/1997 | Trimberger | ......... | G06F 15/7867 326/38 |
| 5,648,732 A * | 7/1997 | Duncan | ............ | H03K 19/17736 326/40 |
| 5,757,207 A * | 5/1998 | Lytle | ...................... | G11C 19/00 326/39 |
| 6,191,610 B1 | 2/2001 | Wittig et al. | | |
| 6,201,408 B1 * | 3/2001 | Skahill | ............. | H03K 19/17704 326/39 |
| 6,292,019 B1 * | 9/2001 | New | .................. | H03K 19/1737 326/38 |
| 6,323,682 B1 | 11/2001 | Bauer et al. | | |

(Continued)

OTHER PUBLICATIONS

Al, Real-Time HDR Video Imaging on FPGA with Compressed Comparametric Lookup Tables, IEEE 27th Canadian Conference on Electrical and Computer Engineering, May 4-7, 2014, CCECE 2014, Toronto, ON, Canada.

(Continued)

*Primary Examiner* — Crystal L Hammond
(74) *Attorney, Agent, or Firm* — Cesari & Reed LLP; R. Michael Reed (57) ABSTRACT

In some embodiments, a circuit may include a configurable logic module including a multiplexer. The multiplexer may include a plurality of data inputs configured to receive one or more bit strings. Each of the one or more bit strings may correspond to a logic operation. The multiplexer may further include a first control input configured to receive a first input signal, a second control input configured to receive a second input signal, and an output configured to provide an output signal corresponding to a selected logic operation based on the first input signal and the second input signal.

19 Claims, 11 Drawing Sheets

(56) References Cited

U.S. PATENT DOCUMENTS

| | | | | |
|---|---|---|---|---|
| 6,388,466 B1 * | 5/2002 | Wittig | ............... | H03K 19/1736 326/40 |
| 6,927,601 B1 * | 8/2005 | Lin | ................. | H03K 19/17736 326/41 |
| 6,943,580 B2 * | 9/2005 | Lewis | ............. | H03K 19/17728 326/37 |
| 6,956,399 B1 * | 10/2005 | Bauer | ............... | H03K 19/17728 326/105 |
| 7,002,370 B1 | 2/2006 | Metzgen et al. | | |
| 7,075,333 B1 | 7/2006 | Chaudhary et al. | | |
| 7,129,748 B1 | 10/2006 | Mccollum et al. | | |
| 7,202,697 B1 * | 4/2007 | Kondapalli | ........ | H03K 19/1736 326/38 |
| 7,256,612 B1 * | 8/2007 | Young | .............. | H03K 19/17728 326/37 |
| 7,268,587 B1 * | 9/2007 | Pham | ............... | H03K 19/17728 326/38 |
| 7,321,237 B2 | 1/2008 | Mccollum et al. | | |
| 7,358,767 B1 | 4/2008 | Metzgen et al. | | |
| 7,443,198 B1 * | 10/2008 | McCollum | ....... | H03K 19/17728 326/39 |
| 7,443,846 B1 | 10/2008 | Metzgen | | |
| 8,447,798 B2 | 5/2013 | Langhammer | | |
| 2007/0236263 A1 * | 10/2007 | Ramaraju | ............. | H03K 3/012 327/112 |
| 2011/0238718 A1 | 9/2011 | Langhammer | | |
| 2013/0293262 A1 | 11/2013 | Takemura | | |

OTHER PUBLICATIONS

Cunha, Quaternary Look-up Tables Using Voltage-Mode CMOS Logic Design, Multiple-Valued Logic, 2007. ISMVL 2007, 37th International Symposium, May 13-16, 2007, IEEE, Oslo.

Huang, A 65 nm 0.165 fJ/Bit/Search 256 x 144 TCAM Macro Design for IPv6 Lookup Tables, IEEE Journal of Solid-State Circuits, Feb. 2011, 507-519, vol. 46, No. 2, IEEE.

Jamieson, Mapping Multiplexers onto Hard Multipliers in FPGAs, IEEE-NEWCAS Conference, 2005, The 3rd International, pp. 323-326, Jun. 19-22, 2005, IEEE.

Purnaprajna, A Case for Heterogeneous Technology-Mapping: Soft versus Hard Multiplexers, Field-Programmable Custom Computing Machines (FCCM), 2013 IEEE 21st Annual International Symposium on Field-Programmable Custom Computing Machines, pp. 53-56, Apr. 28-30, 2013, IEEE, Seattle, WA.

Zilic, Multiple-valued Logic in FPGAs, Department of Electrical and Computer Engineering; University of Toronto,1553-1556, 1993, IEEE, Toronto, ON.

* cited by examiner

CONFIGURABLE LOGIC CIRCUIT INCLUDING DYNAMIC LOOKUP TABLE

FIELD

The present disclosure is generally related to configurable logic circuits, and more particularly to configurable logic circuits that utilize lookup tables.

BACKGROUND

As circuit densities increase, circuit real estate becomes increasingly precious. In logic circuits that utilize lookup tables, the area cost incurred by the lookup table may increase significantly when the number of inputs and complexity of the logic functions increase, which can limit the number of configurable logic units that may be used.

SUMMARY

In some embodiments, a circuit may include a configurable logic module including a multiplexer. The multiplexer may include a plurality of data inputs configured to receive one or more bit strings. Each of the one or more bit strings may correspond to a logic operation. The multiplexer may further include a first control input configured to receive a first input signal, a second control input configured to receive a second input signal, and an output configured to provide an output signal corresponding to a selected logic operation based on the first input signal and the second input signal.

In other embodiments, a circuit may include a lookup table macrocell. The lookup table macrocell may include a register having a plurality of outputs. The register may be configured to store one or more bit strings. Each of the one or more bit strings may be configured to represent a logic function. The lookup table macrocell may further include a multiplexer having a plurality of inputs coupled to the plurality of outputs of the register, a plurality of control inputs configured to receive input signals, and an output. The multiplexer may be configured to implement a logic function in response to the input signals and to provide an output signal to the output based on the logic function.

In still other embodiments, a method may include providing one or more bit strings to a plurality of data inputs of a multiplexer. Each of the one or more bit strings may represent a logic operation. The method may further include applying one or more control input signals to one or more control inputs of the multiplexer to perform a selected logic operation and providing an output signal to an output of the multiplexer according to the selected logic operation and based on the one or more control input signals.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of circuits, apparatuses, and methods are described below that may include a configurable logic module or circuit that may include an area-efficient lookup table providing a large number of values with a limited number of inputs. In some embodiments, the look-up table may be implemented as a multiplexer circuit having eight inputs, three select inputs, and a single output, which multiplexer circuit can be used to provide two hundred and fifty six logic functions. In some embodiments, the large number of logic functions offered by the configurable logic module or circuit can be readily understood and utilized by circuit designers. Additionally, in some embodiments, the configurable logic module may reduce the engineering effort in circuit development of the configurable logic module with respect to register-transfer level (RTL) coding and verification. Specifically, the lookup table may be modelled as a simple eight-input multiplexer.

Figure 1:
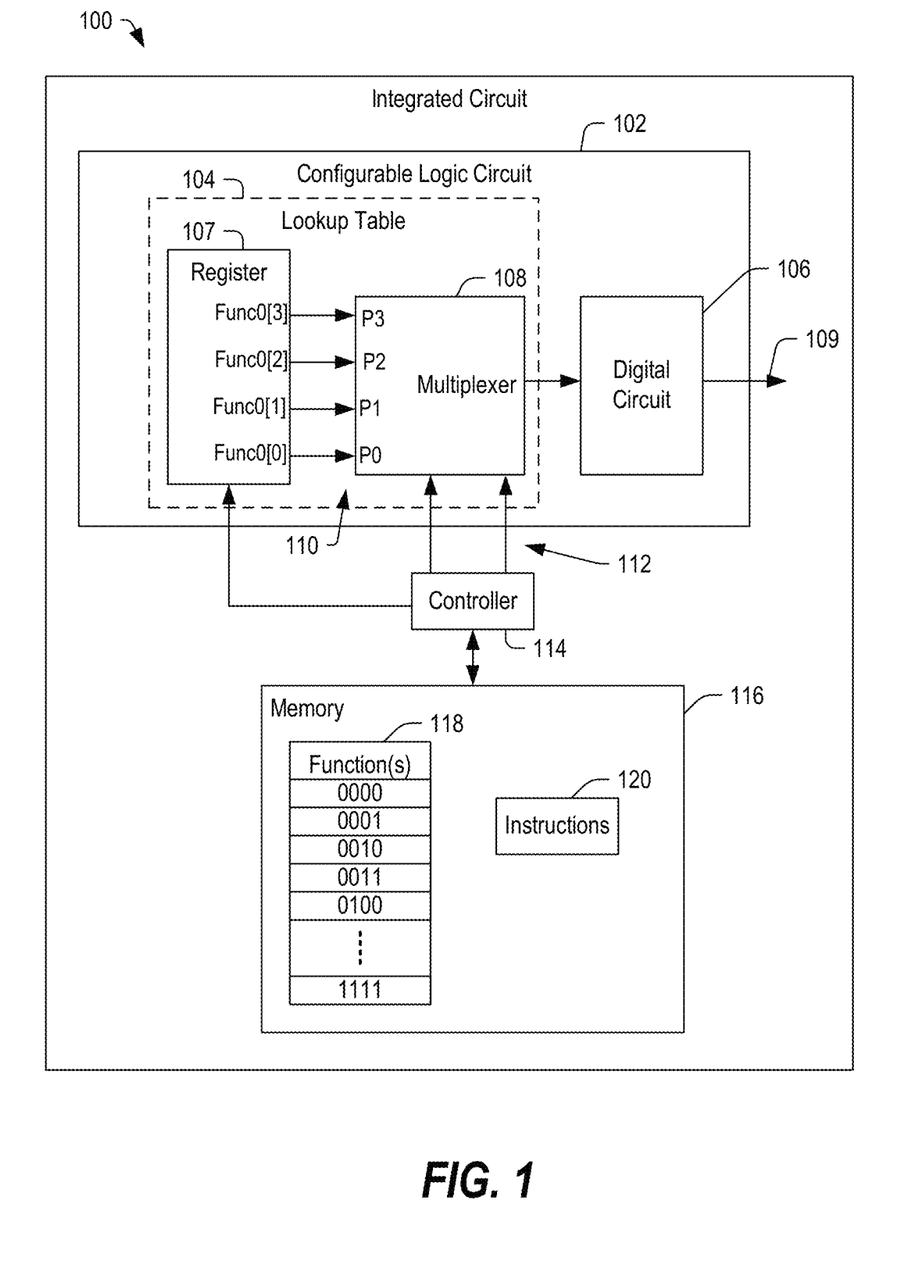
FIG. 1 is a block diagram of an integrated circuit including a configurable logic circuit, in accordance certain embodiments of the present disclosure.

FIG. 1 is a block diagram of an integrated circuit 100 including a configurable logic module 102, in accordance certain embodiments. The configurable logic module 102 may include a lookup table 104, which may be implemented as a register 107 coupled to a plurality of inputs of a multiplexer 108. The register 107 may be configured to store one or more bit strings, each of which may implement a particular logic operation, such as an AND operation, an OR operation, and so on. The multiplexer 108 may include control inputs coupled to control lines 112 and an output, which may be coupled to an input of a digital circuit 106. The digital circuit 106 may receive data (the output of the logic function) from the multiplexer 108 and may operate on the received data to provide an output signal to an output 109. The integrated circuit 100 may also include a controller 114 coupled to the lookup table 104 via the control lines 112. The controller 114 may be coupled to a memory 116, which may store a plurality of bit strings 118. Each of the plurality of bit strings 118 may represent a particular logic function, a particular value, or any combination thereof. In some embodiments, the memory 116 may include instructions 120 that, when executed by the controller 114, may cause the controller 114 to calculate a bit string that represents a particular logic function. In some embodiments, the multiplexer 108 may include a plurality of function inputs 110 to receive the bit string from the register 107, and may include control inputs coupled to the control lines 112.

In some embodiments, the configurable logic circuit (or module) 102 uses the lookup table 104 to implement multi-input logic functions, such as AND operations, OR operations, and other logical operations. The other logical operations may include more complex logic, such as a minimum function, a maximum function, and so on. In some embodiments, each of the inputs 110 of the multiplexer 108 may be coupled to a selected bit string, such that control signals on the control lines 112 may provide a selected output corresponding to a desired logic function performed on the data from the control lines, which may be further processed by the digital circuit 106.

In some embodiments, the controller 114 may configure one or more bit strings and may store the one or more bit strings in the register 107. The bit strings may be provided to the inputs 110 of the multiplexer. In this example, each bit string may include four bits, and the control inputs 112 may provide single or multibit control signals to the control inputs of the multiplexer 108, causing the multiplexer 108 to provide output data corresponding to the selected logical function based on the data at the control lines 112.

Figure 2:
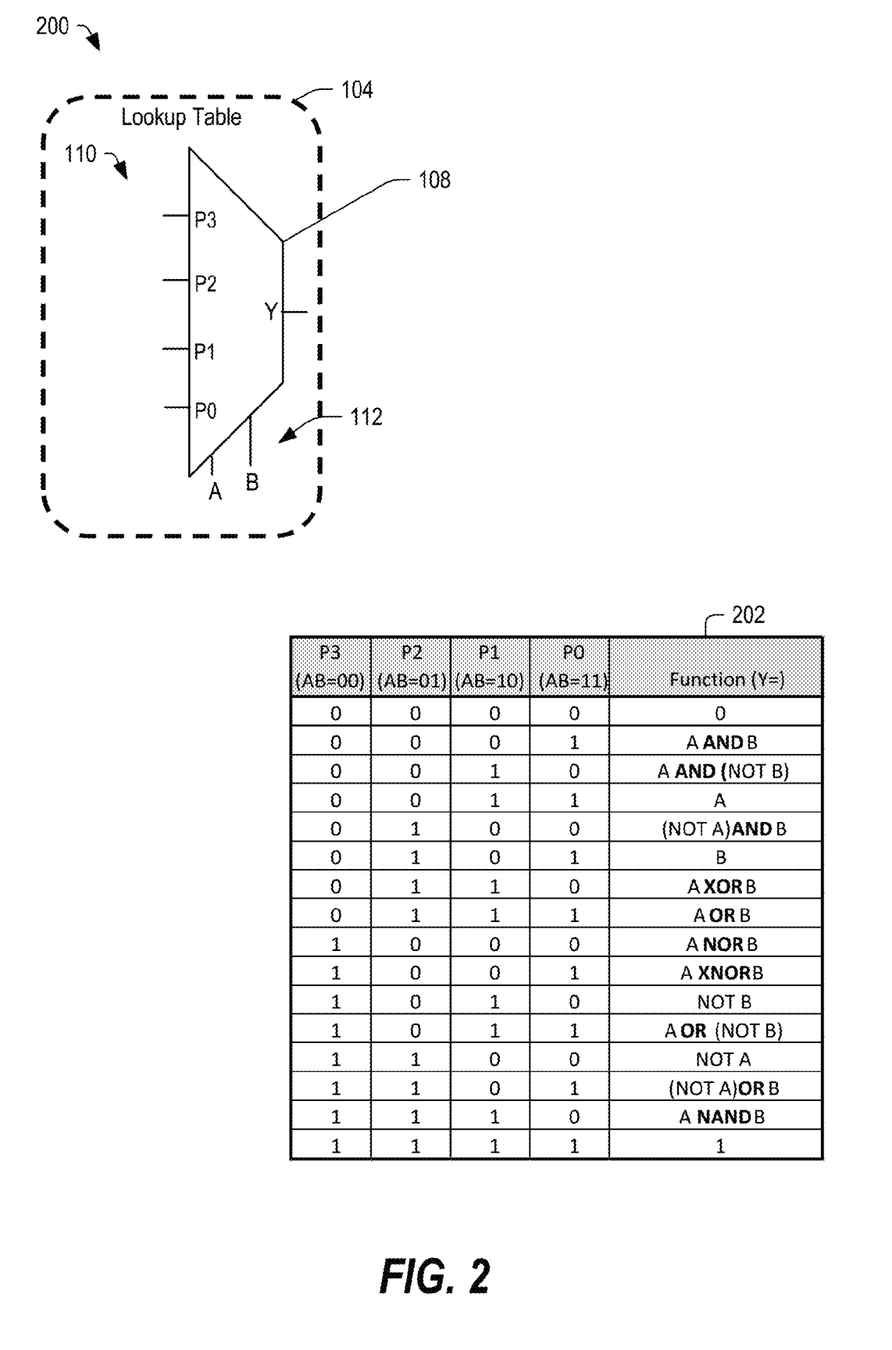
FIG. 2 is a diagram of a lookup table implemented as a multiplexer and a corresponding logic table, in accordance with certain embodiments of the present disclosure.

FIG. 2 is a diagram of a lookup table 200 implemented as the lookup table 104 including a multiplexer 108 of FIG. 1 and a corresponding logic table 202, in accordance with certain embodiments. In some embodiments, the multiplexer 108 may have four data inputs 110 and two control inputs (or control lines) 112, which may cooperate to implement a plurality of logic functions as shown in the logic table 202. In the illustrated example, the data inputs 110 may be coupled to pre-configured bit strings that may be selected by the bit values at the control inputs 112 to perform a logic operation. In a particular example, the register 107 in FIG. 1 may be configured with bit strings. The selected bit string may be written to a selected portion of the register 107, such that data provided to the control inputs 112 may cause the multiplexer 108 to output the logic value that corresponds to the inputs.

In some embodiments, the logic table 202 depicts various logic functions, which may be selected based on the function applied to the data inputs 110 and based on the signals provided to the control inputs 112. By utilizing the multiplexer 108 to provide the functionality of the lookup table 104, the overall circuit size of the configurable logic module or circuit may be reduced because multiple logic operations can be selected from the same digital logic circuit and because the size of the memory needed to implement the lookup table 104 is reduced. In an example, for the input values (P3:P0=0001), the output is zero, unless the values of A and B are both equal to one. If the values of A and B are both equal to one, then the output (Y) is 1.

It should be appreciated that the controller 114 in FIG. 1 may be adapted to configure the register 107 to implement selected functions 118. In some embodiments, the controller 114 may configure the register 107 with selected bits strings as needed, retrieving the selected logic function from memory 118 and writing the bit string to the register 107 on the fly to provide a selected logic function.

In the illustrated example, the multiplexer 108 is shown as a four input multiplexer with four-bit input lines and including two control inputs. The multiplexer 108 may be used to implement ($2^4$) sixteen different and configurable logic operations. However, it should be understood that the multiplexer 108 may be implemented as an eight-input multiplexer with eight-bit input lines and including three control inputs. Such a configuration can be used to implement two hundred and fifty-six ($2^8$) different and configurable logic operations.

Figure 3:
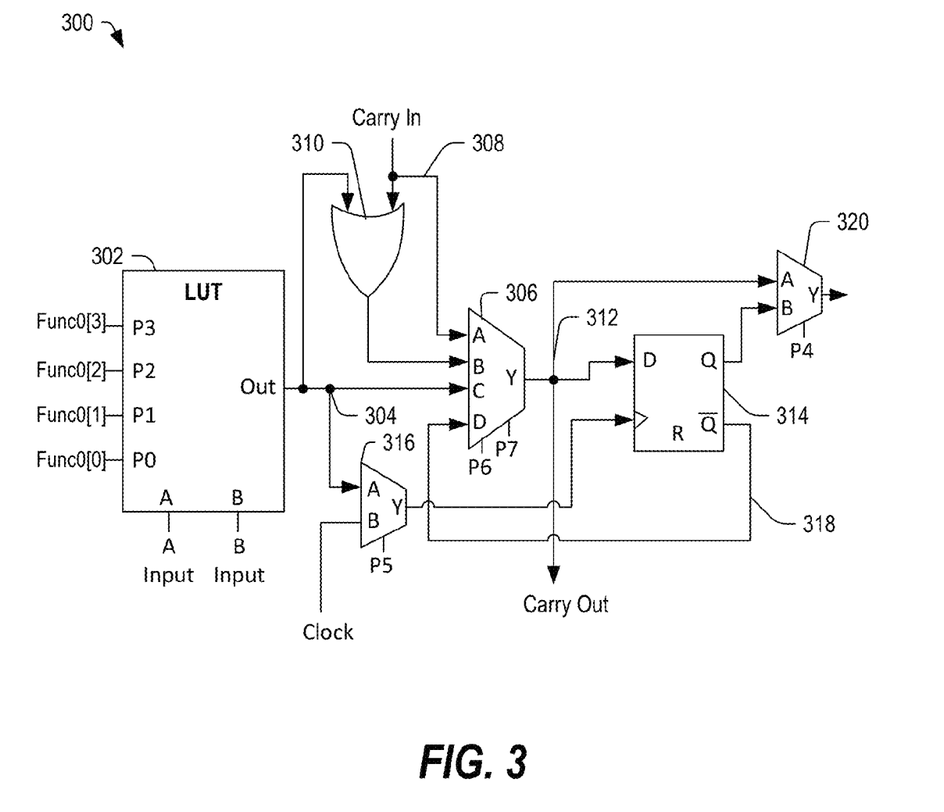
FIG. 3 is a diagram of a configurable logic circuit, in accordance with certain embodiments of the present disclosure.

FIG. 3 is a diagram of a configurable logic circuit 300, in accordance with the certain embodiments. The configurable logic circuit 300 may be a logic macrocell, which may include a lookup table 302, a D-flip-flop 314, and multiplexers 306, 316, and 320. The lookup table 302 may be an embodiment of the lookup table 104 in FIGS. 1 and 2. The lookup table 302 may include a first control input (A Input) and a second control input (B Input) and may include function (or data) inputs (P3, P2, P1, and P0). The function inputs may be coupled to outputs of a register to receive a bit string representing an output of a logic operation.

The lookup table 302 may further include an output coupled to a node 304, which may be coupled to a third input (C) of the multiplexer 306 and to a first input of the multiplexer 316. The multiplexer 306 may further include a first input coupled to a node 308, which may receive a carry in input. The configurable logic circuit 300 may further include a NOR gate 310 including a first input coupled to the node 308, a second input coupled to the node 304, and an output coupled to a second input of the multiplexer 306. The multiplexer 306 may further include a fourth input coupled to a node 318, and may include select inputs (P6 and P7). The multiplexer 306 may also include an output coupled to a node 312.

The configurable logic circuit 300 may also include the D-flip-flop 314 including a D-input coupled to the node 312, a clock input coupled to an output of the multiplexer 316, a Q-output coupled to a second input of the multiplexer 320, and a Q-not-output coupled to the node 318. The node 312 may be coupled to a carry out line, which may be coupled to a carry in node 308 of a next configurable logic circuit, when multiple configurable logic circuits are chained together.

The multiplexer 320 may include a first input coupled to the node 312, a select input (P4), and an output to provide a logic output signal. The multiplexer 316 may include a first input coupled to the node 304, a second input to receive a clock signal, a select input (P5), and an output coupled to the clock input of the D-flip-flop 314.

In some embodiments, the output of the multiplexer 320 may represent any logical expression (Func[n]) of two inputs (A and B). The output may be asynchronous or may be synchronized to a clock signal, depending on the implementation. The carry function allows multiple lookup table outputs to be logically combined (such as being OR-ed together). In some embodiments, the D-flip-flop 314 may toggle in response to a logical expression of multiple inputs. In some embodiment, the clock of the D-flip-flop 314 may be gated under firmware or hardware control. In some embodiments, the signal at the D-input of the D-flip-flop 314 may be provided from a first source and its clock signal may be provided from another.

In the illustrated example, the configurable logic circuit 300 may be implemented using only eight programming bits, which eight bits may be provided by one of the function inputs received from the register 107 (in FIG. 1). In some embodiments, the area of the configurable logic circuit 300 may be approximately 250 $\mu m^2$, not including the programming bits.

It should be appreciated that the example embodiment of the configurable logic circuit 300 in FIG. 3 represents one possible embodiment of a logic macrocell design. However, other embodiments are also possible, and the specific implementation may be determined based on factors such as power consumption, speed, and circuit area.

Figure 4:
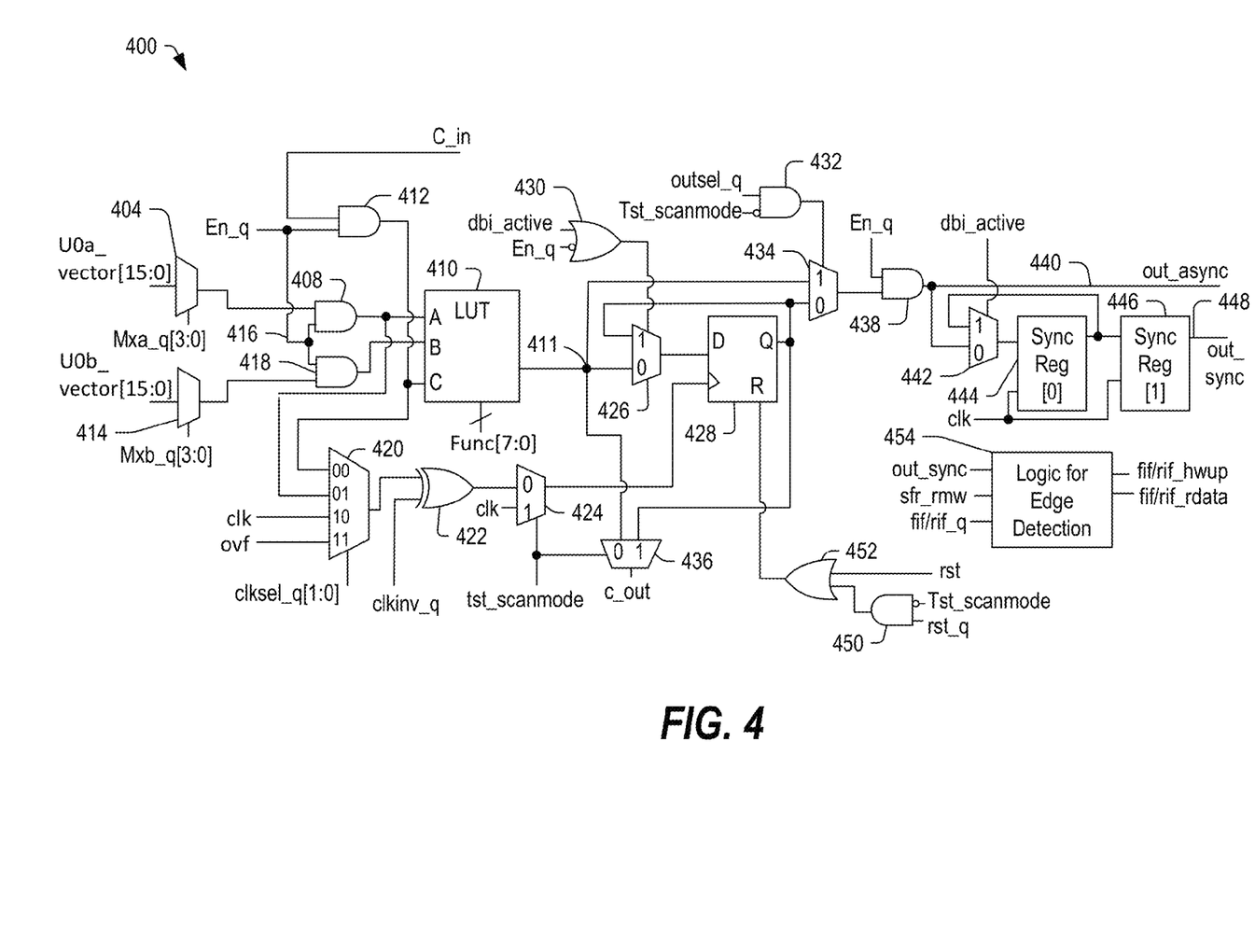
FIG. 4 is a diagram of a configurable logic circuit, in accordance with certain embodiments of the present disclosure.

FIG. 4 is a diagram of a configurable logic circuit 400, in accordance with the certain embodiments. The configurable logic circuit 400 may include a lookup table 410, which may be implemented as the lookup table 104 in FIGS. 1 and 2 or the lookup table 302 in FIG. 3. The configurable logic circuit 400 may include a first multiplexer 404 including 16 inputs, four select inputs, and an output that is coupled to a first input of an AND gate 408. The AND gate 408 may include a second input coupled to a node 416 that is configured to receive an enable input, and may include an output coupled to a first input of the lookup table 410. The node 416 is also coupled to an input of an AND gate 412, which may include a second input to receive a carry in signal, and may include an output coupled to a third input of the lookup table 410.

The configurable logic circuit 400 further may include a second multiplexer 414 including 16 inputs, four select inputs, and an output that is coupled to a first input of an AND gate 418, which has a second input coupled to the node 416, and an output coupled to the second input of the lookup table 410. The lookup table 410 may include a function select input (which may be eight bits), and an output coupled to a node 411.

The configurable logic circuit 400 may further include a multiplexer 420 including a first input coupled to the output of the AND gate 412, a second input coupled to the output of the AND gate 408, a third input to receive a clock signal, a fourth signal to receive an overflow signal, a select input to receive a clock select signal (2 bits), and an output coupled to an input of an XOR gate 422. The XOR gate 422 may include a second input to receive an inverted version of the clock signal, and may include an output coupled to an input of a multiplexer 424. The multiplexer 424 may include a second input to receive a clock signal, a select input to receive a test or scan mode signal, and an output coupled to a clock input of a D-flip-flop 428.

The configurable logic circuit 400 may also include a multiplexer 426 including a first input coupled to a Q-output of the D-flip-flop 428, a second input coupled to the node 411, a select input coupled to an output of an OR gate 430, and an output coupled to a D-input of the D-flip-flop 428. The OR gate 430 may include a first input to receive a debug interrupt active signal, a second input to receive an inverted version of the enable signal (such as the enable signal at the node 416), and an output coupled to the select input of the multiplexer 426.

The configurable logic circuit 400 may further include an AND gate 432 including a first signal to receive an output select signal, a second input to receive a test scan mode signal, and an output coupled to a select input of a multiplexer 434. The multiplexer 434 may include a first input coupled to the node 411, a second input coupled to the Q-output of the D-flip-flop 428, and an output coupled to an input of an AND gate 438. The AND gate 438 may include a second input to receive an enable signal, and an output coupled to a node 440 to provide an asynchronous output signal (out_asynch). The configurable logic circuit 400 may also include a multiplexer 436 including a first input coupled to the node 411, a second input coupled to the Q-output of the D-flip-flop 428, a select input coupled to the select input of the multiplexer 424, and an output to provide a carry out signal.

The configurable logic circuit 400 may also include a multiplexer 442 including a first input coupled to the node 440 and a select input to receive a debug interrupt active signal. The multiplexer 442 may also include an output coupled to a synchronization register 444, which has a clock input to receive a clock signal and an output that may be coupled to the second input of the multiplexer 442 and to an input of a second synchronous register 446. The second synchronous register 446 may also include a clock input to receive the clock signal and an output coupled to a node 448 to provide a synchronous output signal (out_sync).

The configurable logic circuit 400 may also include an AND gate 450 including a first input to receive a reset signal, a second input to receive an inverted version of the test scan mode signal, and an output coupled to an input of an OR gate 452. The OR gate 452 may also include a second input to receive a reset signal, an output coupled to a reset input of the D-flip-flop 428.

In some embodiments, the configurable logic circuit 400 may be configured using various select signals applied to multiplexers 404, 414, 420, 424, 426, 434, 436, and 442. Further, the configurable logic circuit 400 may be configured based on the bit sequence (or function) applied to the inputs of the lookup table 410. It should be appreciated that the lookup table 410 is turned on its side relative to the lookup tables 104 and 302 in FIGS. 1, 2, and 3, such that the control inputs A, B, and C are shown on the side, while the data inputs are along the bottom. In this example, it should be appreciated that there may be eight data inputs, each of which may receive an eight-bit data string.

In some embodiments, the configurable logic circuit 400 may include logic for edge detection 454, which may apply one or more signals to configure the logic to perform an edge detection function. The logic for edge detection 454 allows for rising edge detection interrupt enable or falling edge detect interrupt enable.

In some embodiments, the first control input (A) of the lookup table 410 may receive an input from 16 possible input sources (selectable via the multiplexer 404). Similarly, the second control input (B) of the lookup table 410 may receive an input from 16 possible input sources (selectable via the multiplexer 414). Further, the data inputs may receive multiple bit strings, each of which may represent a logic function.

In some embodiments, either the output of the lookup table 410 or the output of the D-flip-flop 428 may be provided as the asynchronous output at the node 440. When the enable signal is held low, the input values at the inputs of the lookup table 410 have no effect on the outputs, and the outputs at nodes 440 and 448 may be held low. In some embodiments, multiple configurable logic circuit modules may be coupled to input multiplexers and to each other to form a configurable logic module. One possible example is described below with respect to FIG. 5.

Figure 5:
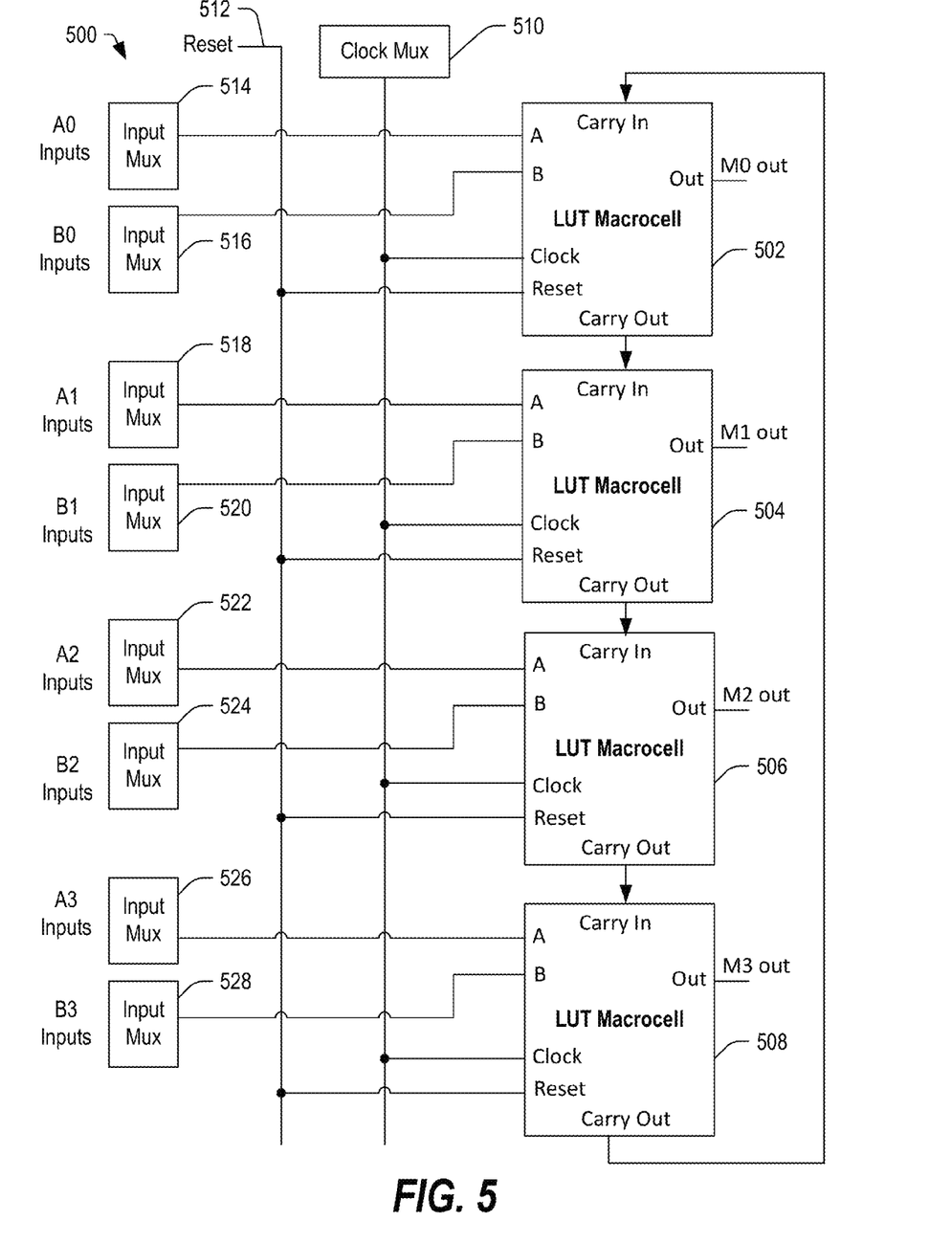
FIG. 5 is a block diagram of a configurable logic module, in accordance with certain embodiments of the present disclosure.

FIG. 5 is a block diagram of a configurable logic module 500, in accordance with the certain embodiments. The configurable logic module 500 may include a plurality of lookup table macrocells, including macrocells 502, 504, 506, and 508. The configurable logic module 500 may include first and second input multiplexers 514 and 516 coupled to the A input and the B input, respectively, of the lookup table macrocell 502. The lookup table macrocell 502 may further a clock input coupled to an output of a clock multiplexer 510, and a reset input coupled to a reset node 512.

The macrocell 504 may include an A input coupled to an input multiplexer 518, a B input coupled to an input multiplexer 520, a clock input coupled to the output of the clock multiplexer 510, and a reset input coupled to the reset node 512. The macrocell 506 may include an A input coupled to an input multiplexer 522, a B input coupled to an input multiplexer 524, a clock input coupled to the output of the clock multiplexer 510, and a reset input coupled to the reset node 512. The macrocell 508 may include an A input coupled to an input multiplexer 526, a B input coupled to an input multiplexer 528, a clock input coupled to the output of the clock multiplexer 510, and a reset input coupled to the reset node 512.

Each of the lookup table macrocells 502, 504, 506, and 508 may include a "carry in" input and a "carry out" output. In some embodiments, the "carry out" output of the lookup table macrocell 502 may be coupled to the "carry in" input of the lookup table macrocell 504. The "carry out" output of the lookup table macrocell 504 may be coupled to the "carry in" input of the lookup table macrocell 506. The "carry out" output of the lookup table macrocell 506 may be coupled to the "carry in" input of the lookup table macrocell 508. The "carry out" output of the lookup table macrocell 508 may be coupled to the "carry in" input of the lookup table macrocell 502. In some embodiments, this circular structure may be used to provide a carry chain with no macrocell hierarchy. In some embodiments, a single clock may be used for all macrocell flops. In other embodiments, each macrocell may have a different clock. In some embodiments, each lookup table macrocell 502, 504, 506, and 508 may have a common set/reset line 512 or may have separate set/reset lines. By modularizing the lookup table and logic circuitry into a lookup table macrocell, simple and complex logic operations may be implemented based on the selected functions, by chaining multiple lookup table macrocells together, or any combination thereof.

In some embodiments, the crossbar architecture that may be employed with an input/output portion of a system on a chip or integrated circuit may provide an avenue for configuring input/output signals to and from the configurable logic module. Crossbar signals may be bi-directional, which increases the number of signal paths for the configurable logic module. One possible example of such a crossbar implementation is described below with respect to FIG. 6.

Figure 6:
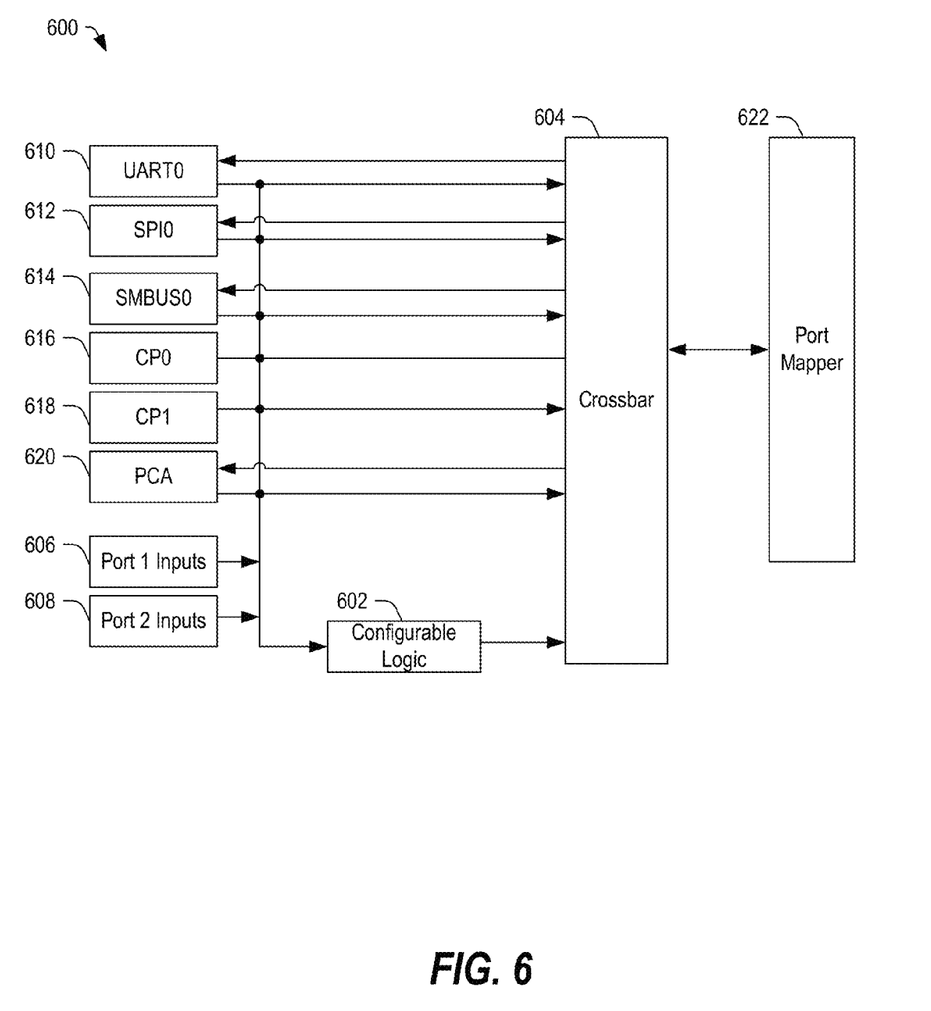
FIG. 6 is a block diagram of a circuit including a configurable logic module between multiple peripherals and a crossbar, in accordance with certain embodiments of the present disclosure.

FIG. 6 is a block diagram of a circuit 600 including a configurable logic module 602 between multiple peripherals and a crossbar 604, in accordance with the certain embodiments. The configurable logic module 602 may include one or more inputs coupled to a universal asynchronous receiver/transmitter (UART) 610, a special peripheral interface (SPI0) 612, a system management bus (SMBUS) 614, comparators (CP0 and CP1) 616 and 618, a programmable counter array (PCA) 620, and port inputs 606 and 608. The configurable logic module 602 may also include an output coupled to the crossbar 604, which may be coupled to a port mapper 622.

In some embodiments, signals from the crossbar 604 (provided through at least one of the peripherals 610, 612, 614, 616, 618, and 620) and signals from the ports 606 and 608 may be provided to the configurable logic module 602. In some embodiments, the inputs to the peripherals may be processed by the configurable logic module 602 as well. In some embodiments, the configurable logic module 602 may be coupled to a subset of the peripherals (such as serial peripherals) or to a single PCA channel, and so on.

In some embodiments, the configurable logic module 602 may be placed between the crossbar 604 and the port mapper 622. In some embodiments, an intermediate signal routing bus may be used to selectively route signals to the configurable logic module 602. In some embodiments, the configurable logic module 602 may be used to trigger interrupts, even if the interrupt signal is not routed to a pin or a peripheral. For example, the configurable logic module 602 may be used to generate an interrupt that can be useful to wake up a microcontroller unit (MCU), such as to initiate a transition from a low power mode (i.e., a sleep mode) to a second operating mode, such as a receive mode. In some embodiments, a portion of the configurable logic module 602 may be implemented using high voltage logic circuitry, while the remainder may use relatively low voltage logic circuitry.

Figure 7:
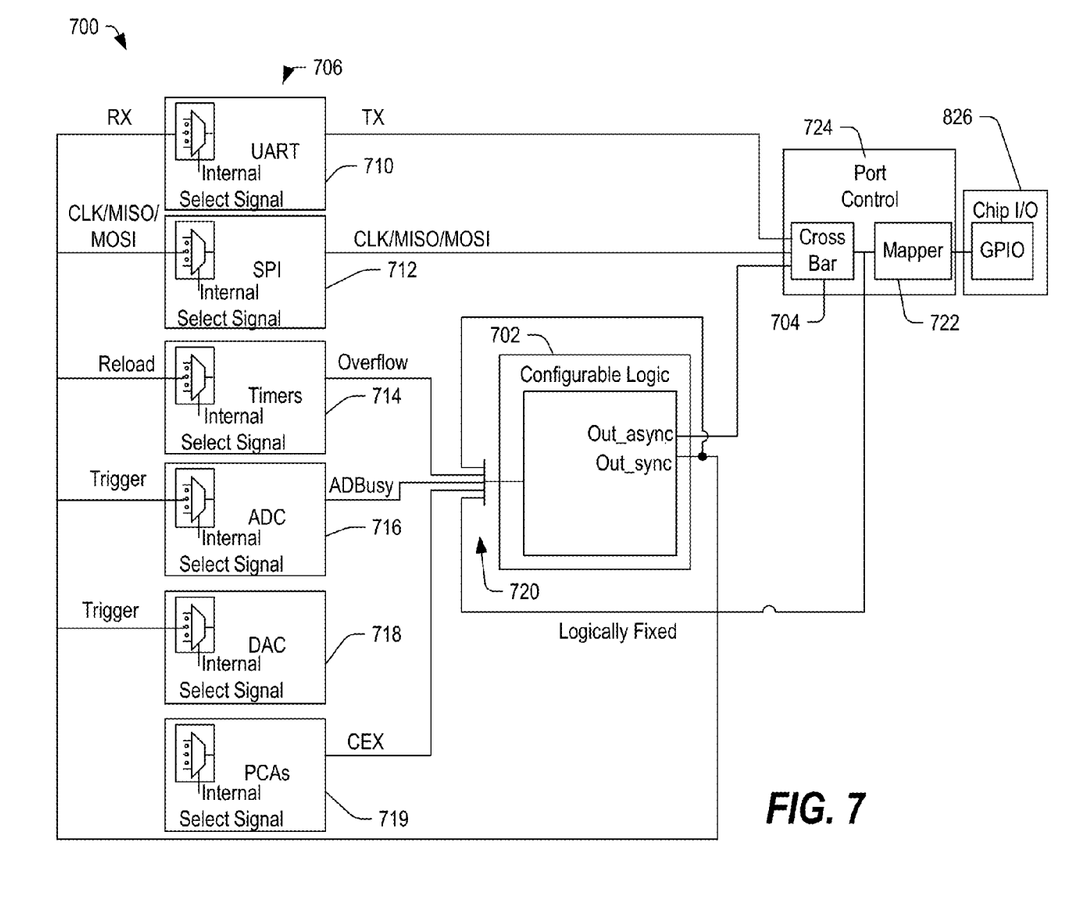
FIG. 7 is a diagram of a configurable logic module, in accordance with certain embodiments of the present disclosure.

FIG. 7 is a diagram of a circuit 700 including a configurable logic module 702, in accordance with the certain embodiments. The configurable logic module 702 may be coupled to a crossbar 704, which may be coupled to a port mapper 722 of a port control circuit 724. The port mapper 722 may be coupled to a chip input/output 726, such as a general purpose input/output (GPIO).

The circuit 700 may include a selector circuit 720 including a first input coupled to an output of a timer 714, a second input coupled to an output of an analog-to-digital converter (ADC) 716, and a third input coupled to an output of a PCA 719. The selector circuit 720 may include a fourth input coupled to a synchronous output of the configurable logic module 702 and a fifth input coupled to a node between the crossbar 704 and the port mapper 722. The circuit 700 may further include a UART 710 and a serial peripheral interface 712, each of which may include an input coupled to the synchronous output of the configurable logic module and an output coupled to the crossbar 704. The circuit 700 may also include a digital-to-analog converter (DAC) 718.

In the illustrated example, the UART 710, the SPI 712, the timers 714, the ADC 716, the DAC 718, and the PCAs 719 may be referred to as peripherals 706. The peripherals 706 may include one or more multiplexers that may be controlled by internal select signals to provide a selected output to the configurable logic module 702 or to the crossbar 704. In some embodiments, the configurable logic module 702 may include one or more multiplexers configurable to implement a variety of logic functions. In some embodiments, any of the elements may provide inputs to the configurable logic module 702 either via the selector circuit 720 or via the crossbar 704.

In the illustrated example, the UART 710, the SPI 712, the timers 714, the ADC 716, the DAC 718, and the PCAs 719 may be referred to as peripherals 706. The peripherals 706 may include one or more multiplexers that may be controlled by internal select signals that allow the selection of the input from among several different signals, including an output from the configurable logic module 702. In this way the configurable logic module 702 can modify input signals to the peripherals 706. For example, in some embodiments the chip may receive a UART RX signal that is modulated by a clock signal, and this RX signal must first be demodulated before it can be processed by the UART peripheral 710. In this example, the configurable logic module 702 can be programmed to perform an XOR function on two input signals. The first input signal is the modulated RX signal, and it may be received on a pin and routed through the Chip I/O 726 and the Mapper 722 to the configurable logic module 702. The second input signal may be an overflow signal from Timer 714, representing a clock. The RX input of UART 710 can be configured to receive an output of configurable logic module 702. In this manner the modulated RX signal is demodulated by the configurable logic module 702 before being applied to the input of the UART peripheral 710. It should be clear from FIG. 7 that configurable logic module 702 is capable of being used to modify many input and output signals from peripherals 706 and from port control 724.

Figure 8:
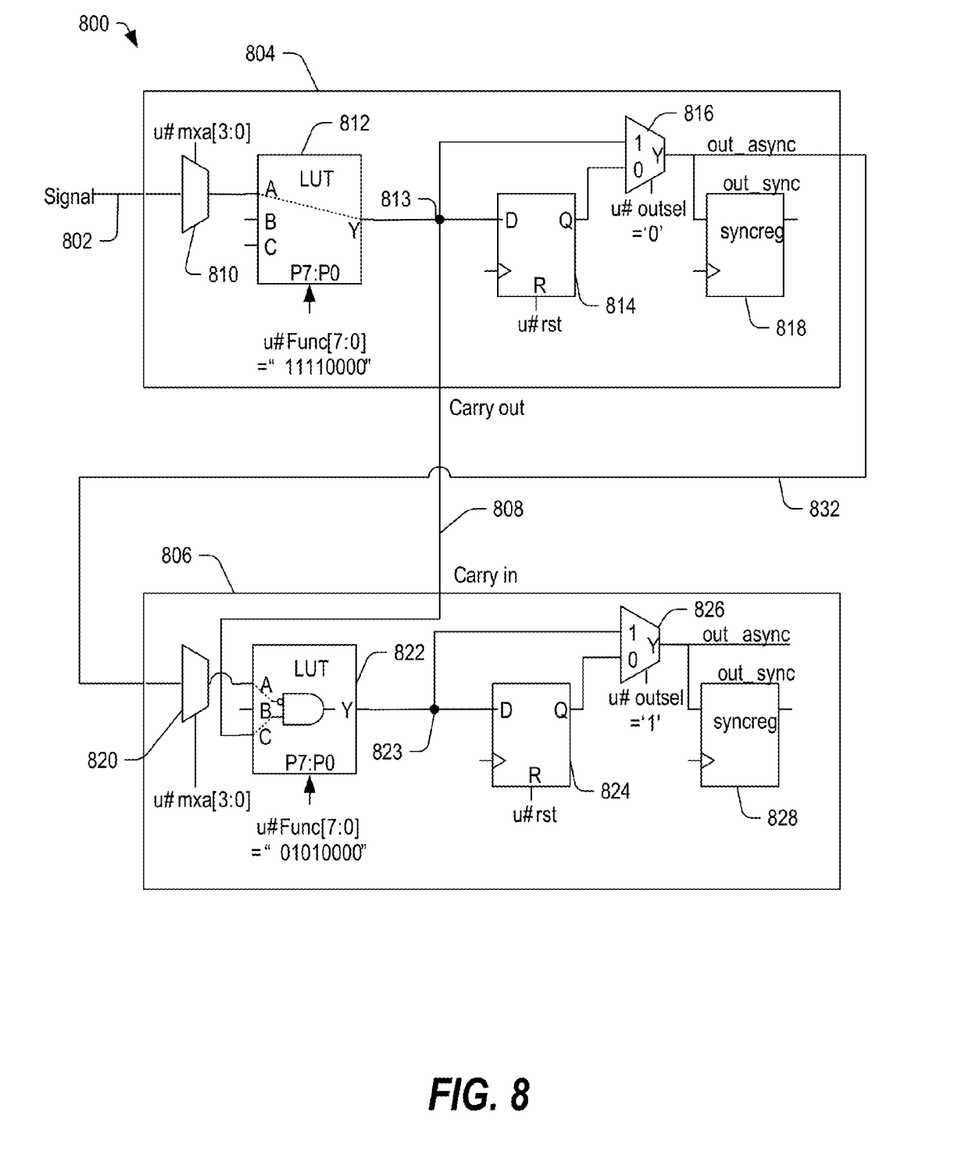
FIG. 8 is a block diagram of a circuit including configurable logic modules configured to generate a pulse, in accordance with certain embodiments of the present disclosure.

FIG. 8 is a block diagram of a circuit 800 including configurable logic modules 804 and 806 configured to generate a pulse, in accordance with certain embodiments. The circuit 800 may include an input 802 to receive a signal. The input 802 may be coupled the configurable logic module 804 and may provide the signal to at least one input of a multiplexer 810, which includes a selection input (4 bits) and an output coupled to a first input of a lookup table 812. The lookup table 812 may include a second input, a third input, one or more selection inputs, and an output, which may be coupled to a node 813. The node 813 may be coupled to a D-input of a D-flip-flop 814, which may include a clock input, a reset input, and a Q-output. The Q-output of the D-flip-flop 814 may be coupled to an input of a multiplexer 816, which may have a second input coupled to the node 813, a select input, and an output coupled to a node 832 to provide an asynchronous output signal. The node 832 may be coupled to an input of a synchronous register 818, which may include a clock input and an output to provide a synchronous output signal.

In some embodiments, the node 832 may be provided to at least one input of a multiplexer 820, which includes a selection input (4 bits) and an output coupled to a first input of a lookup table 822. The lookup table 822 may include a second input, a third input, one or more selection inputs, and an output, which may be coupled to a node 823. The node 823 may be coupled to a D-input of a D-flip-flop 824, which may include a clock input, a reset input, and a Q-output. The Q-output of the D-flip-flop 824 may be coupled to an input of a multiplexer 826, which may have a second input coupled to the node 823, a select input, and an output to provide an asynchronous output signal. A line 808 may couple the node 813 of the configurable logic circuit 804 to the c-input of the lookup table 822. Similarly, the node 823 may be coupled by a corresponding line (not shown) to a lookup table of a next configurable logic module, depending on the implementation.

In some embodiments, the lookup table 812 may be configured to provide a pass-through (i.e., Y=A). In this example, if the input signal 802 is low, then both of the inputs to lookup table 822 are low, and the second asynchronous output (out_async) of the configurable logic module 806 is low. If the input signal 802 switches high, then the A input of the lookup table 822 will stay low for one clock cycle but the C input will transition to a high level, and the asynchronous output (out_async) of the configurable logic module 806 will transition to a high level. After one clock cycle, the A input of lookup table 822 will also transition to a high level, and the asynchronous output (out_async) of the configurable logic module 806 will transition low again, hence generating a pulse. In some embodiments, to provide the above pulse generation function, the function selection signal (Func[7:0]) of the lookup table 812 would need to implement the expression Y=A, which it can do if the A input provided to the lookup table 812 is the most significant bit (MSB) and the C input provided to the lookup table 812 is the least significant bit (LSB) of the three selection inputs. However, the function selection signal (Func[7:0]) of the lookup table 822 may implement the expression Y=A*Cb instead of Y=Ab*C, where Cb and Ab are the complements of C and A, respectively.

Figure 9:
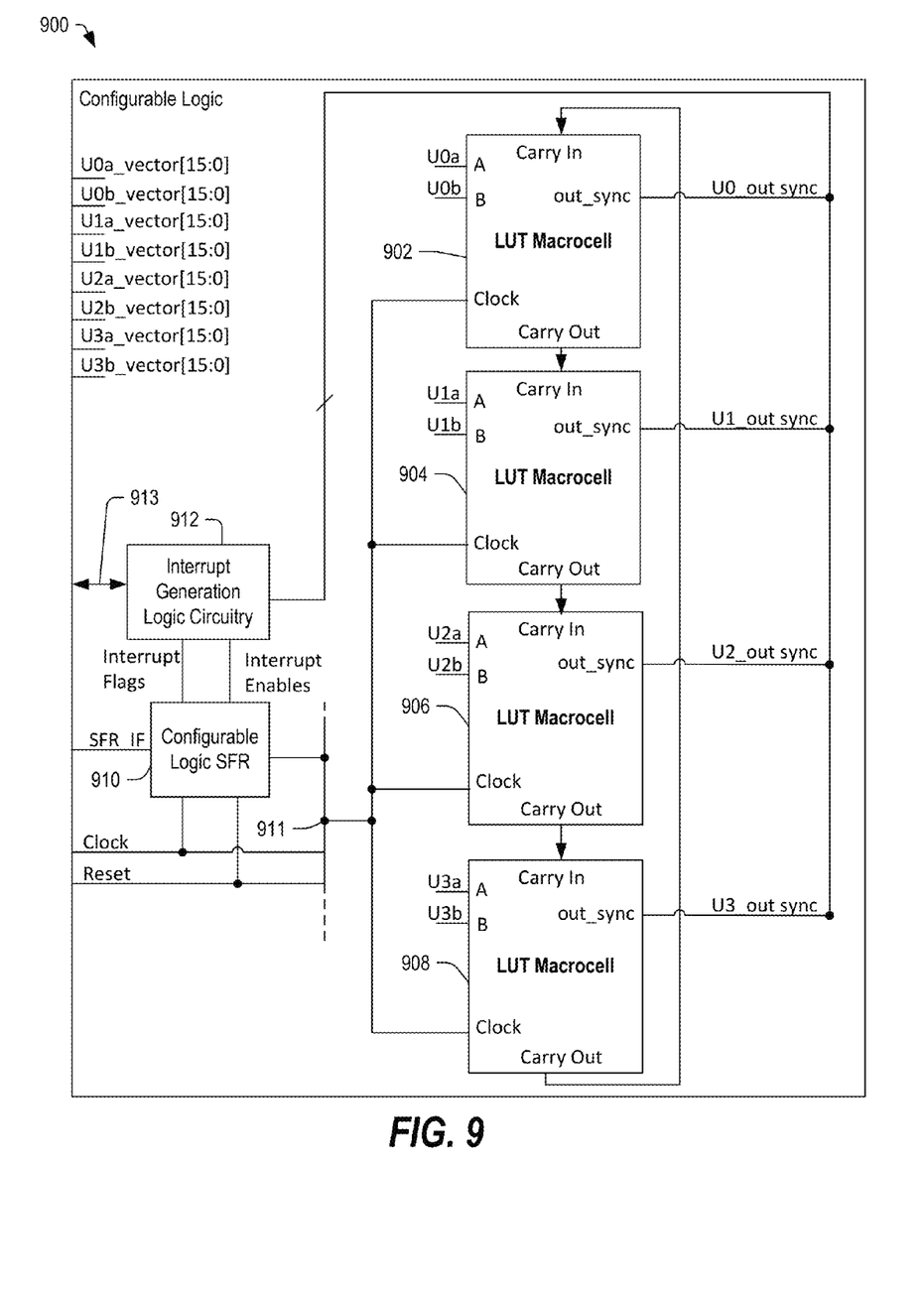
FIG. 9 is a block diagram of an integrated circuit including multiple lookup table macrocells implemented using a multiplexer and configurable logic circuitry, in accordance with certain embodiments of the present disclosure.

FIG. 9 is a block diagram of an integrated circuit 900 including multiple lookup table macrocells 902, 904, 906, and 908, in accordance with certain embodiments. The integrated circuit 900 may include multiple input vectors, which may be selectively provided, via multiplexers, to the A and B inputs of the various lookup table macrocells 902, 904, 906, and 908. Further, the integrated circuit 900 may include a clock input and a reset input. The integrated circuit 900 may include a special function register (SFR) interface coupled to a configurable logic SFR 910, which may include inputs coupled to a clock input and a reset input. Further, the configurable logic SFR 910 may include an input/output coupled to a node 911, which may be coupled to inputs (such as clock inputs) of the lookup table macrocells 902, 904, 906, and 908. The configurable logic SFR 910 may be coupled to interrupt generation logic circuitry 912, which may include an output 913 to provide an interrupt signal, for example, to a central processing unit (CPU).

In some embodiments, the interrupt signal may be provided to an associated circuit through the output 913 to initiate a circuit operation, such as to cause the associated circuit to switch from a first mode (e.g., a low power mode) to a second mode (such as a relatively higher power mode). In some embodiments, the CPU (not shown) may set interrupt enables in the configurable logic SFR 912 and may read the interrupt flags through the SFR interface. If an interrupt enable for a particular macrocell is set, then a change in the output state of that macrocell may cause the interrupt generation logic circuitry 912 to issue an interrupt to the CPU via the output 913, which interrupt may cause the CPU to execute an interrupt service routine that can switch the device from a first mode to a second mode.

In some embodiments, the architecture of the circuit 900 includes four configurable logic macrocells and other logic blocks, which may be configured to implement the SFR interface and interrupt generation. In other embodiments, the circuit 900 may include additional configurable logic macrocells.

In some embodiments, the configurable logic SFR 910 may be configured with a plurality of bit strings, each of which may implement a particular logic function in response to control inputs (A and B). By configuring the bit strings in the configurable logic SFR 910, the lookup tables 902, 904, 906, and 908 may be configured to implement a particular set of logic functions. The configurable logic SFR 910 may be programmed during operation as needed. In some embodiments, the configurable logic SFR 910 may be configured to store a plurality of bit strings configured to implement a plurality of selected logic functions, which may be commonly used logic functions, while one or more rows of the configurable logic SFR 910 may be changed as needed to implement selected logic functions.

Figure 10:
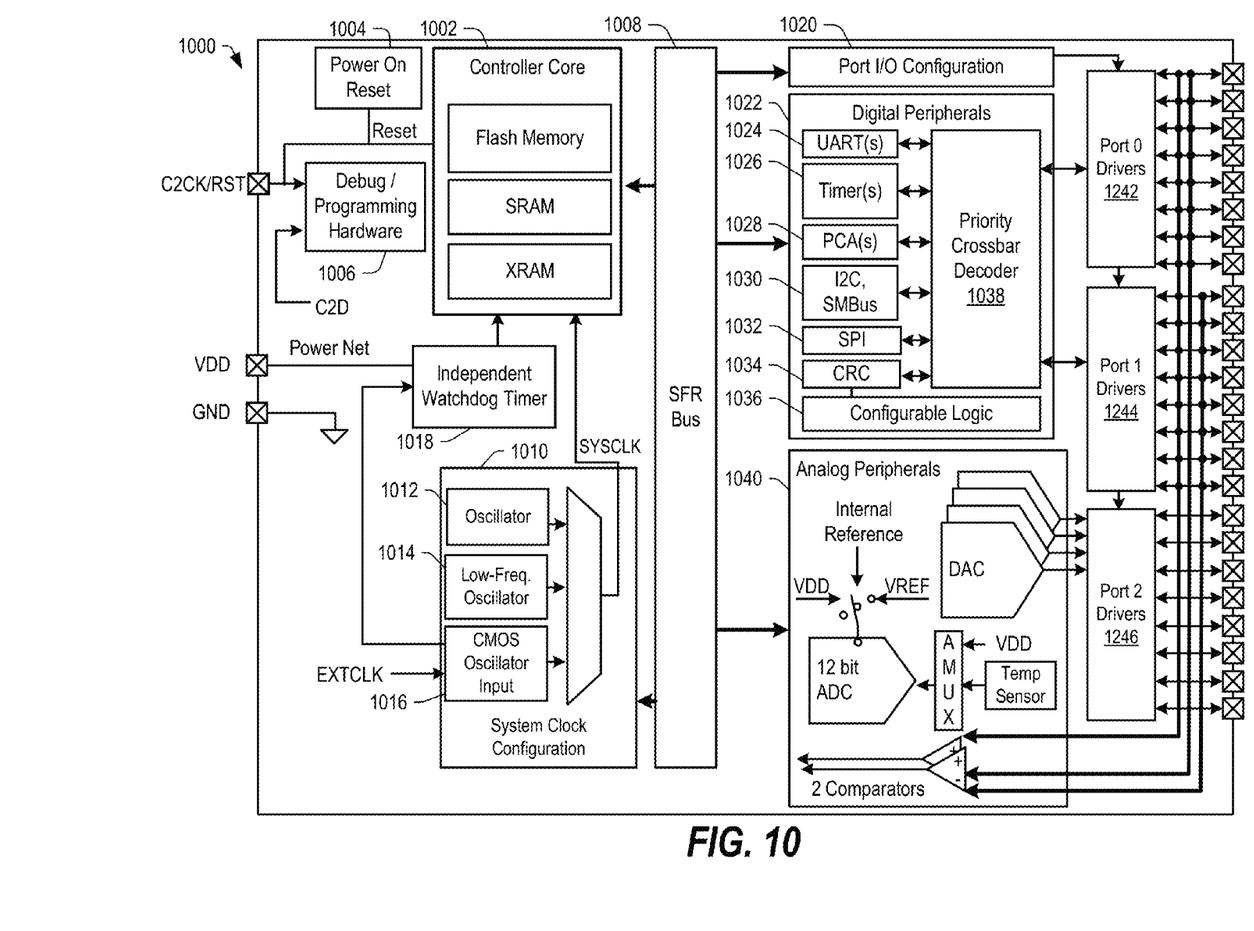
FIG. 10 is a diagram of an integrated circuit including configurable logic circuitry, in accordance with certain embodiments of the present disclosure.

FIG. 10 is a diagram of an integrated circuit 1000 including configurable logic circuitry 1036, in accordance with certain embodiments. The integrated circuit 1000 may include a clock input (C2CK/RST), a power input (VDD), and a ground input (GND), and a plurality of general purpose inputs/outputs (I/Os). The integrated circuit 1000 includes a power on reset circuit 1004 coupled to a controller core 1002 and to debug/programming hardware 1006. The controller core 1002 may include flash memory, synchronous random access memory (SRAM), and an external memory (XRAM). The controller core 1002 may be coupled to a special function register (SFR) bus 1008, which may be coupled to a system clock configuration module 1010. The system clock configuration module 1010 may include an oscillator 1012, a low frequency oscillator 1014, and a CMOS oscillator input 1016 to receive an external clock signal. The system clock configuration module 1010 may also include a multiplexer configured to select between the signals and to provide a system clock signal to the controller core 1002. Further, the integrated circuit 1000 may include an independent watchdog timer 1018 coupled to the CMOS oscillator input 1016, to the power supply input, and to the controller core 1002.

The integrated circuit 1000 may further include a port input/output (I/O) configuration circuit 1020 having an input coupled to the SFR bus 1008 and an output coupled to each of a plurality of port drivers 1042, 1044, and 1046. The integrated circuit 1000 may further include a digital peripherals circuit 1022 including one or more UARTs 1024, one or more timers 1026, one or more PCAs 1028, an I$^2$C or SMBUS 1030, a serial peripheral interface 1032, an error detection circuit, such as a cyclic redundancy code (CRC) circuit 1034, and the configurable logic circuitry 1036. The configurable logic circuitry 1036 may be coupled to one or more of the peripherals and to a priority crossbar decoder 1038. The configurable logic circuitry 1036 may include one or more lookup table macrocells.

The integrated circuit 1000 may further include analog peripherals 1040, such as analog-to-digital converters (ADCs), digital-to-analog converters (DACs), analog multiplexers, temperature sensors, and comparators. The analog peripherals 1040 may be coupled to the SFR bus 1008.

In some embodiments, the configurable logic circuitry 1036 may be dynamically configured to provide a selected logic function. In some embodiments, the configurable logic circuitry 1036 may include multiple lookup table macrocells. In some embodiments, the configurable logic circuitry 1036 may be configured to implement 256 different logic functions based on selected combinations of the inputs. In some embodiments, a three-input lookup table module may be implemented using a single eight-input multiplexer and may be configured to implement two hundred fifty-six logic functions. Such an implementation is area efficient, despite the large number of functions implemented.

Figure 11:
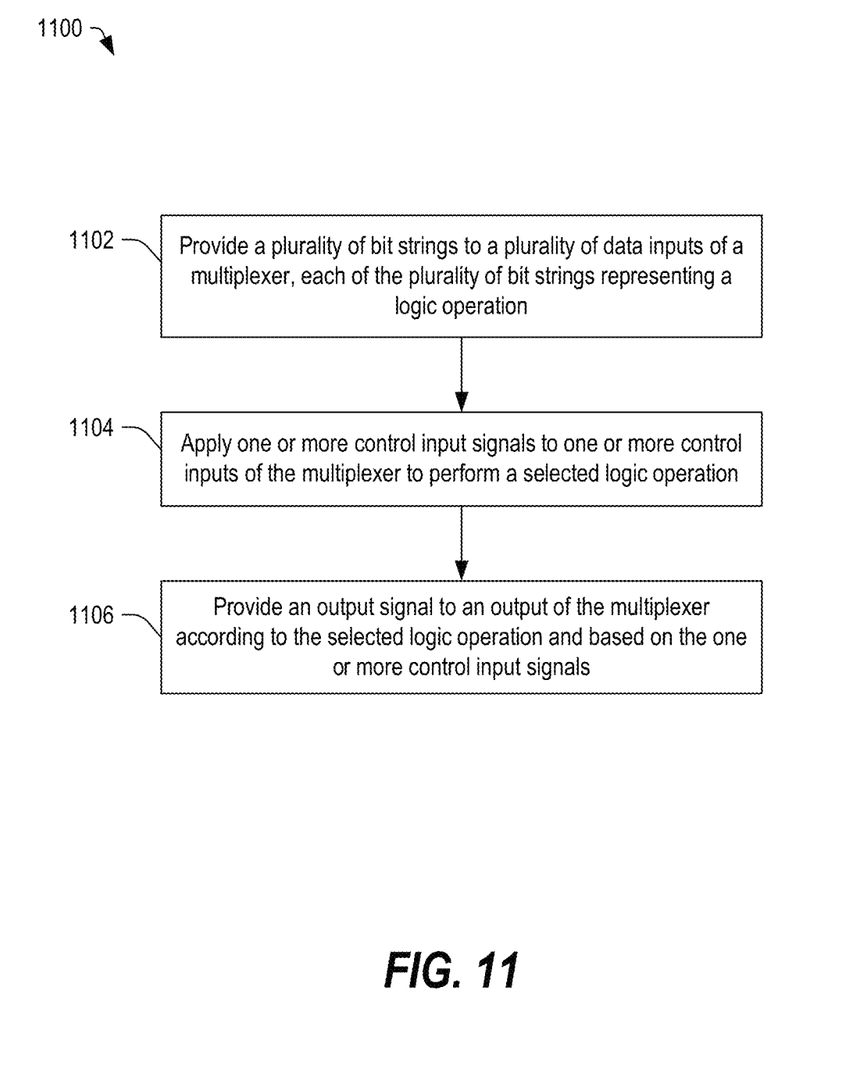
FIG. 11 is a flow diagram of a method of providing a logic operation using a multiplexer, in accordance with certain embodiments of the present disclosure.

FIG. 11 is a flow diagram of a method 1100 of providing a logic operation using a multiplexer, in accordance with certain embodiments of the present disclosure. At 1102, a plurality of bit strings are provided to a plurality of data inputs of a multiplexer. Each of the plurality of bit strings represents a logic operation. The bit strings may be stored in a programmable register, which may be programmed by a controller, such as a microcontroller unit (MCU).

Advancing to 1104, one or more control input signals may be applied to one or more control inputs of the multiplexer to perform a selected logic operation. The one or more control input signals may be provided from another configurable logic circuit, from a GPIO, from other circuitry, or any combination thereof.

Proceeding to 1106, an output signal may be provided to an output of the multiplexer according to the selected logic operation and based on the one or more control input signals. In some embodiments, the output signal may be the result of a logic operation performed on the control input signals.

In some embodiments, the number of bits in the bit strings and the control inputs cooperate to provide a programmable number of logic operations. In an example, if the bit strings are eight bits long, a multiplexer having three control inputs may be programmed to provide up to two hundred fifty-six different logic operations.

In conjunction with the circuits described above with respect to FIGS. 1-11, a configurable logic module is disclosed that includes a lookup table (implemented as a multiplexer) and associated digital logic, which may be configured to implement various logic functions. In some embodiments, the lookup table and the associated digital logic may provide a configurable logic module, which may be coupled to other configurable logic modules to implement complex functions, to generate a pulse based on a rising edge, to generate an interrupt, to provide other logic functions, or any combination thereof. Further, since the lookup table operation may be configured using input signals, the output of the logic circuit may be configured on the fly to provide a desired logical operation.

In some embodiments, a controller, such as a microcontroller unit (MCU) or the controller core 1002, may selectively provide control signals to the configurable logic module, such as the configurable logic circuitry 1036 in FIG. 10, to implement a selected logic function. In some embodiments, the controller may control the configurable logic circuitry 1036 to provide a selected logic function in response to receiving an input from a particular peripheral device. In certain embodiments, the controller may selectively configure bit strings within a special purpose register associated with the configurable logic 1036 to implement selected logic functions.

Using a multiplexer, rather than a traditional AND plane and OR plane, to implement the lookup table can result in substantial circuit area savings. For example, using a widely-available standard cell library in a 0.18 μm CMOS process technology, implementing a lookup table with three select inputs occupies 300.7 μm$^2$ of circuit area when using a conventional AND-OR structure. However, the circuit area may be reduced to 140.5 μm$^2$ when using an 8-input multiplexer from the same standard cell library. These results can vary depending on the standard cell library and drive strength that is chosen, but will generally show a significant area reduction using the multiplexer implementation. Further, the programmability of the multiplexer allows for implementation of a wide range of logic functions without increasing the circuit area.

Although the present invention has been described with reference to preferred embodiments, workers skilled in the art will recognize that changes may be made in form and detail without departing from the scope of the invention.

What is claimed is:
1. A circuit comprising:
   a configurable logic module including:
      a multiplexer including:
         a plurality of data inputs configured to receive one or more bit strings, each of the one or more bit strings including a plurality of bits corresponding to a logic operation;
         a first control input configured to receive a first input signal;
         a second control input configured to receive a second input signal, and
         an output configured to provide an output signal corresponding to a result of a selected logic operation determined from the plurality of data inputs, the selected logic operation performed on the first input signal and the second input signal to produce an output; and
      a register configured to store the one or more bit strings, each of the one or more bit strings including multiple bits, the register including a plurality of outputs coupled to the plurality of data inputs.
2. The circuit of claim 1, wherein:
   the multiplexer further includes a third control input configured to receive a third input signal; and the output signal corresponds to the selected logic operation based on the first input signal, the second input signal, and the third input signal.

3. The circuit of claim 2, wherein:
the plurality of data inputs includes eight data inputs; and
the multiplexer is configurable to implement two hundred fifty-six different logic operations.

4. The circuit of claim 1, further comprising a plurality of input multiplexers, each of the plurality of input multiplexers including a plurality of inputs, at least one control input, and an output coupled to one of the first control input and the second control input of the multiplexer.

5. The circuit of claim 1, further comprising a plurality of configurable logic modules including a second configurable logic module coupled to an output of the first configurable logic module.

6. The circuit of claim 5, wherein:
the second configurable logic module includes an output; and
the configurable logic module and the second configurable logic module cooperate to provide a pulse at the output of the second configurable logic module representing a rising edge of an input signal at the at least one selected input.

7. The circuit of claim 1, further comprising:
a plurality of peripheral circuits, at least one of the plurality of peripheral circuits coupled to a respective one of the plurality of inputs of the configurable logic module; and
a crossbar coupled to an output of the configurable logic module and coupled to the plurality of peripheral circuits and to at least one port driver circuit.

8. A circuit comprising:
a first lookup table macrocell including:
a register including a plurality of outputs, the register configured to store one or more bit strings, each of the one or more bit strings including a plurality of bits configured to represent a logic function of a plurality of logic functions; and
a multiplexer including a plurality of inputs coupled to the plurality of outputs of the register, a plurality of control inputs configured to receive input signals, a carry in input coupled to a carry out output of a second lookup table macrocell, and an output, the multiplexer configured to implement a logic function in response to the input signals and to provide an output signal to the output based on the logic function as applied to the input signals received at the plurality of control inputs and based on a carry out signal at the carry in input.

9. The circuit of claim 8, further comprising an interrupt generator circuit coupled to the output of the multiplexer and configured to generate an interrupt signal in response to the output signal.

10. The circuit of claim 8, wherein the register is programmable.

11. The circuit of claim 10, wherein:
each of the one or more bit strings includes eight bits;
the plurality of inputs includes eight inputs;
the plurality of control inputs includes three control inputs; and
the multiplexer is configurable to provide two hundred fifty-six different logic operations.

12. The circuit of claim 8, further comprising logic circuitry coupled to the output of the multiplexer.

13. The circuit of claim 12, wherein the logic circuitry comprises a synchronous register including an input coupled to the output of the multiplexer, a clock input to receive a clock signal, and a synchronous output to provide the output signal synchronized to the clock signal.

14. The circuit of claim 8, wherein the lookup table macrocell further comprises a carry out output coupled to the output and configured to provide a carry out signal.

15. The circuit of claim 14, further comprising the second lookup table macrocell including:
a first input coupled to the output of the first lookup table macrocell; and
the carry in input coupled to the carry out output of the lookup table macrocell.

16. A method comprising:
providing one or more bit strings to a plurality of data inputs of a first multiplexer, each of the one or more bit strings including a plurality of bits representing a logic operation;
providing one or more second bit strings to a second plurality of inputs of a second multiplexer, each of the one or more second bit strings including a second plurality of bits representing the logic operation;
applying one or more control input signals to one or more control inputs of the first multiplexer and one or more second control input signals to one or more control inputs of the second multiplexer to produce a first multiplexer output and a second multiplexer output, respectively;
providing the first multiplexer output to a first data input of a third multiplexer and the second multiplexer output to a second data input of the third multiplexer;
applying one or more control signals to one or more control inputs of the third multiplexer to determine a selected logic operation; and
providing an output signal to an output of the multiplexer according to the selected logic operation applied to the one or more control input signals.

17. The method of claim 16, wherein providing the one or more bit strings comprises programming a register with the plurality of bit strings, the register including a plurality of outputs coupled to the plurality of data inputs of the multiplexer.

18. The method of claim 17, wherein the register is programmed by a control circuit to provide one or more selected logic operations.

19. The method of claim 16, wherein applying the one or more control input signals to the one or more control inputs comprises multiplexing a plurality of inputs to provide one of the plurality of inputs to a corresponding one of the one or more control inputs of the multiplexer.

* * * * *